US009922953B2

(12) United States Patent
Gondcharton et al.

(10) Patent No.: US 9,922,953 B2

(45) Date of Patent: Mar. 20, 2018

(54) PROCESS FOR PRODUCING A STRUCTURE BY ASSEMBLING AT LEAST TWO ELEMENTS BY DIRECT ADHESIVE BONDING

(71) Applicant: COMMISSARIAT A L'ENERGIE ATOMIQUE ET AUX ENERGIES ALTERNATIVES, Paris (FR)

(72) Inventors: Paul Gondcharton, Grenoble (FR); Lamine Benaissa, Massy (FR); Bruno Imbert, Grenoble (FR); Hubert Moriceau, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/121,855

(22) PCT Filed: Feb. 26, 2015

(86) PCT No.: PCT/EP2015/053984

§ 371 (c)(1),
(2) Date: Aug. 26, 2016

(87) PCT Pub. No.: WO2015/128399

PCT Pub. Date: Sep. 3, 2015

(65) Prior Publication Data

US 2017/0025377 A1 Jan. 26, 2017

(30) Foreign Application Priority Data

Feb. 27, 2014 (FR) ..................................... 14 51602

(51) Int. Cl.

*H01L 21/00* (2006.01)
*H01L 21/47* (2006.01)

(Continued)

(52) U.S. Cl.

CPC ............ *H01L 24/83* (2013.01); *H01L 21/185* (2013.01); *H01L 24/03* (2013.01); *H01L 24/05* (2013.01);

(Continued)

(58) Field of Classification Search

CPC ......... H01L 24/83; H01L 21/18; H01L 24/03; H01L 24/27; H01L 24/29; H01L 24/80

(Continued)

(56) References Cited

U.S. PATENT DOCUMENTS 5,972,179 A * 10/1999 Chittipeddi ........... C23C 14/046 204/192.15
6,962,835 B2 11/2005 Tong et al.

(Continued)

FOREIGN PATENT DOCUMENTS

FR 2 947 481 A1 1/2011
FR 2 963 158 A1 1/2012

(Continued)

OTHER PUBLICATIONS

English Translation of FP: FR 2969814 A1.*

(Continued)

*Primary Examiner* — Sheikh Maruf

(74) *Attorney, Agent, or Firm* — Oblon, McClelland, Maier & Neustadt, L.L.P.

(57) ABSTRACT

A method for producing a structure by direct bonding of two elements, the method including: production of the elements to be assembled and assembly of the elements. The production of the elements to be assembled includes: deposition on a substrate of a TiN layer by physical vapor deposition, and deposition of a copper layer on the TiN layer. The assembly of the elements includes: polishing the surfaces of the copper layers intended to come into contact so that they have a roughness of less than 1 nm RMS and hydrophilic prop- (Continued)

E2"
115
112
114
15
12
14
4
E1"

erties, bringing the surfaces into contact, and storing the structure at atmospheric pressure and at ambient temperature.

17 Claims, 3 Drawing Sheets

(51) Int. Cl.
*H01L 21/44* (2006.01)
*H01L 23/00* (2006.01)
*H01L 21/18* (2006.01)
*H01L 25/00* (2006.01)
*H01L 25/065* (2006.01)

(52) U.S. Cl.
CPC .............. *H01L 24/27* (2013.01); *H01L 24/29* (2013.01); *H01L 24/80* (2013.01); *H01L 25/0657* (2013.01); *H01L 25/50* (2013.01); *H01L 2224/0345* (2013.01); *H01L 2224/0381* (2013.01); *H01L 2224/03452* (2013.01); *H01L 2224/03845* (2013.01); *H01L 2224/0508* (2013.01); *H01L 2224/05073* (2013.01); *H01L 2224/05147* (2013.01); *H01L 2224/05166* (2013.01); *H01L 2224/05181* (2013.01); *H01L 2224/05184* (2013.01); *H01L 2224/05186* (2013.01); *H01L 2224/05571* (2013.01); *H01L 2224/05647* (2013.01); *H01L 2224/2745* (2013.01); *H01L 2224/2755* (2013.01); *H01L 2224/27845* (2013.01); *H01L 2224/29147* (2013.01); *H01L 2224/80055* (2013.01); *H01L 2224/8083* (2013.01); *H01L 2224/8092* (2013.01); *H01L 2224/80357* (2013.01); *H01L 2224/80895* (2013.01); *H01L 2224/80896* (2013.01); *H01L 2224/80948* (2013.01); *H01L 2224/83895* (2013.01); *H01L 2225/06524* (2013.01); *H01L 2924/01005* (2013.01); *H01L 2924/01006* (2013.01); *H01L 2924/01008* (2013.01); *H01L 2924/01015* (2013.01); *H01L 2924/01016* (2013.01); *H01L 2924/01017* (2013.01); *H01L 2924/04941* (2013.01); *H01L 2924/04953* (2013.01)

(58) Field of Classification Search
USPC .................... 438/107, 106, 18; 257/723, 724
See application file for complete search history.

(56) References Cited

U.S. PATENT DOCUMENTS

2004/0124531 A1* 7/2004 Venkatraman .......... C23C 16/30 257/751
2004/0184219 A1* 9/2004 Otsuka .............. H01L 23/49805 361/306.3
2005/0003664 A1* 1/2005 Ramanathan ........... H01L 24/11 438/689
2005/0014311 A1* 1/2005 Hayasaka ......... H01L 21/76898 438/109
2005/0104216 A1* 5/2005 Cabral, Jr. ............... C25D 9/08 257/758
2005/0239278 A1* 10/2005 Li ..................... H01L 21/76807 438/618
2006/0223301 A1* 10/2006 Vanhaelemeersch . H01L 21/762 438/618
2008/0001241 A1* 1/2008 Tuckerman ......... H01L 31/0203 257/434
2008/0116584 A1* 5/2008 Sitaram ................... H01L 24/02 257/777
2009/0061629 A1* 3/2009 Preusse ............. H01L 21/02068 438/680
2011/0076390 A1* 3/2011 Cerio, Jr. .............. C23C 18/161 427/96.8
2012/0094469 A1 4/2012 Landru
2012/0100657 A1* 4/2012 Di Cioccio ......... B81C 1/00269 438/51
2012/0241961 A1 9/2012 Kagawa et al.
2013/0270328 A1 10/2013 Di Cioccio et al.
2013/0270703 A1* 10/2013 Zierath ............. H01L 21/76877 257/751
2014/0131874 A1 5/2014 Kagawa et al.
2015/0177458 A1* 6/2015 Bowers .................. G02B 6/131 385/14

FOREIGN PATENT DOCUMENTS

FR 2 969 814 A1 6/2012
FR 2969814 A1 * 6/2012 ............. H01L 24/05

OTHER PUBLICATIONS

Edited by Krishna Seshan, "8.3 Copper Interconnect Processing, Handbook of Thin Film Deposition," Elsevier, Jul. 19, 2012, XP55195181. (3 pages).
J. Cho, et al. "Mechanism of Low-Temperature Copper-to-Copper Direct Bonding for 3D TSV Package Interconnection," 2013 Electronic Components & Technology Conference, May 28, 2013, XP032474322, pp. 1133-1140.
K. N. Chen, et al., "Microstructure evolution and abnormal grain growth during copper wafer bonding," Applied Physics Letters, American Institute of Physics, vol. 81, No. 20, Nov. 11, 2002, XP012032510, pp. 3774-3776.
Lea Di Cioccio, et al., "Enabling 3D Interconnects with Metal Direct Bonding," Interconnect Technology Conference 2009, Jun. 1, 2009, XP031477562, pp. 152-154.
International Search Report issued Aug. 5, 2015 in PCT/EP2015/053984 filed Feb. 26, 2015.
French Search Report issued Oct. 17, 2014 in FR 1451602 filed Feb. 27, 2014.
U.S. Appl. No. 13/808,703, filed Jan. 7, 2013, US2013-0111719 A1, Chrystel Deguet, et al.
U.S. Appl. No. 14/555,897, filed Nov. 28, 2014, US2015-0155170 A1, Shay Reboh, et al.
U.S. Appl. No. 14/893,396, filed Nov. 23, 2015, US2016-0126215 A1, Bruno Imbert, et al.
U.S. Appl. No. 14/901,027, filed Dec. 27, 2015, Thomas Signamarcheix, et al.
U.S. Appl. No. 14/910,553, filed Feb. 5, 2016, US2016-0189995 A1, Paul Gondcharton, et al.
U.S. Appl. No. 15/028,640, filed Apr. 11, 2016, Lamine Benaissa, et al.
U.S. Appl. No. 15/028,876, filed Apr. 12, 2016, Lamine Benaissa, et al.
U.S. Appl. No. 15/028,836, filed Apr. 12, 2016, Lamine Benaissa, et al.

* cited by examiner

PROCESS FOR PRODUCING A STRUCTURE BY ASSEMBLING AT LEAST TWO ELEMENTS BY DIRECT ADHESIVE BONDING

CROSS-REFERENCE TO RELATED APPLICATIONS

This application is a National Stage of PCT/EP2015/053984, which was filed on Feb. 26, 2015. This application is based upon and claims the benefit of priority to French application No. 1451602, which was filed on Feb. 27, 2014.

TECHNICAL FIELD AND PRIOR ART

This invention relates to a process for producing a structure by assembling at least two elements by direct bonding, the surface to be assembled of each element comprising at least one copper portion, the method allowing the fracture energy of the structure to be enhanced.

The three-dimensional integration in microelectronic and nanoelectronic devices reduces the size of the devices, reduces their power consumption, increases the transmission speeds, heightens performance levels and increases the operating frequency, etc.

Three-dimensional integration can in particular include the steps of bonding with the alignment of the bonding pads, thinning and vertical interconnection through stacking by means of connection vias. However, in order to obtain a high interconnection density and to simplify the technology, elements are preferably assembled, and in particular connections by metal-metal bonding.

For example, copper is one of the metals specifically used for bonding pads.

Different metal-metal bonding techniques exist, in particular based on direct bonding, i.e. bonding without the provision of adhesive material. These techniques can include thermocompression, which consists in bringing the elements into contact with each other, applying uniaxial pressure on either side of the assembly and heating the stack. The pressure required is close to one MPa and a temperature exceeding 250° C. is required to obtain bonding with high mechanical strength. The drawback of this technique is the implementation of high temperatures (exceeding 250° C.), which can be incompatible with certain assembled structures.

Another technique consists in bringing metal surfaces into contact with each other under an ultra-high vacuum after activation by ionic bombardment of the surfaces. This step enables substrates to be assembled at ambient temperature under compression, however requires an ultra-high vacuum bonding environment which is difficult to implement in the industry.

Another technique exists, described in document FR 2947481, comprising a step for activating the surfaces by chemical-mechanical polishing and cleaning. The surfaces brought into contact with each other have a roughness of less than 1 nm RMS and are hydrophilic. Bonding can therefore take place at room temperature and under atmospheric pressure, in particular in air and without uniaxial pressure applied when the plates are brought into contact with each other.

However, the assembly thus obtained provides a low fracture energy after bonding (typically less than 1 J/m$^2$). In order to reach a sufficient fracture energy, compatible with microelectronic circuit integration methods, the MEMS packaging (including, for example, the chip cut-out, mechanical thinning, etc.), the assemblies must be stored for up to several months at ambient temperature. A storage time of this length is not conceivable for industrial use, in particular in the field of microelectronics.

DESCRIPTION OF THE INVENTION

Therefore, one purpose of this invention is to propose a method for producing a structure by assembling at least two elements by direct bonding, wherein the kinetics for enhancing the fracture energy are encouraged at ambient temperature.

The "enhancing of the fracture energy" is understood as the increase in energy that must be provided to separate the two elements assembled via direct bonding. By encouraging the kinetics for enhancing the fracture energy, the increase in fracture energy is accelerated when compared to the methods of the prior art.

The aforementioned purpose is achieved by a method for producing a structure by assembling at least two elements by direct bonding, comprising the production of the elements and the assembly of the elements.

The production of the elements comprises the following steps:

- deposition on a substrate of at least one portion of a given material via physical vapour deposition, forming a growth portion, the given material being chosen from either $TiN_x$ or $TaN_x$,
- deposition on the portion of given material of at least one portion of copper.

The conditions for depositing the growth portion by physical vapour deposition are such that the layer of copper has a mainly crystallographic orientation along the (220) direction.

The assembly of the elements comprises the following steps:

- polishing the surfaces of the elements comprising the copper portion so that they have a roughness of less than 1 nm RMS and hydrophilic properties,
- bringing the two surfaces into contact,
- storage.

Thanks to the step involving the physical vapour deposition of the growth portion, the copper deposited on this portion encourages the kinetics for enhancing the fracture energy at ambient temperature.

Physical vapour deposition is in particular understood as sputtering, cathodic arc deposition, electron beam physical vapour deposition, evaporative deposition or pulsed laser deposition.

Indeed, the inventors have observed that the choice of a specific deposition technique, i.e. the physical vapour deposition, and of specific conditions for forming a specific material layer on which a layer of copper will be deposited and grow, enables the layer of copper to grow according to a preferential crystallinity which enhances the fracture energy at ambient temperature according to faster kinetics than with the methods of the prior art and under much less restrictive conditions.

Preferably, the layer of copper formed on the layer of specific material has a ratio between the intensity of the peak representing the orientation (220) and the intensity of the peak representing the orientation (111) of greater than or equal to 0.5.

Advantageously, the physical vapour deposition takes place at a low temperature, for example between −196° C.

(77K) and 250° C., preferably between 0° C. and 150° C. and more preferably between 20° C. and 100° C., or even between 20° C. and 50° C.

Moreover, bonding can advantageously take place in air, at ambient temperature and without the application of pressure between the two assembled elements.

Therefore, thanks to the invention, a structure is produced having an enhanced rupture energy that is obtained in a faster and simpler manner.

Advantageously, the portion of copper is deposited by physical vapour deposition.

One could consider depositing on the portion of copper at least one other portion of copper, for example by electrochemical deposition.

In a very advantageous manner, chemical species can be incorporated into the copper to further encourage the kinetics of enhancing the fracture energy.

The subject-matter of the invention therefore is a method for producing a structure by the direct bonding of two elements comprising the production of the elements to be assembled and the assembly of said elements, wherein the production of the elements to be assembled comprises the following steps:

- deposition on a substrate of at least one growth portion made from a material chosen from $TiN_x$ and $TaN_x$, said growth portion being deposited by physical vapour deposition,
- deposition of at least one first portion of copper on all or part of the growth portion, the conditions for depositing the growth portion by physical vapour deposition being such that the ratio between the peak intensities is greater than or equal to 0.5, whereby the peaks are measured by X-Ray diffraction, and wherein the assembly of said elements comprises the following steps:

- polishing the surfaces of the first portions of copper intended to come into contact so that they have a roughness of less than 1 nm RMS and hydrophilic properties,
- bringing said surfaces into contact,
- storing said structure at a low temperature.

Preferably, the deposition of the growth portion by physical vapour deposition takes place at a temperature between −196° C. and 250° C.

More preferably, the deposition of the growth portion by physical vapour deposition takes place at a temperature between 20° C. and 100° C.

Advantageously, the conditions for the deposition of the growth portion by physical vapour deposition are such that the first portion of copper has a growth favouring the less dense planes such as the planes of families (110) and (100).

The material of the growth portion can be TiN.

Preferably, the first portion of copper is formed by physical vapour deposition.

As a variant, at least one second portion of copper can be provided for, formed on the first portion of copper of at least one of the elements. The second portion of copper can be formed by electrochemical deposition, atomic deposition, physical vapour deposition or chemical vapour deposition, etc.

The method can include a step for incorporating at least one chemical species in or on the first or second copper layer. The at least one chemical species can be chosen from boron and/or carbon, and/or phosphorus and/or sulphur and/or chlorine and/or oxygen.

The incorporation of at least one chemical species can take place by ion implantation and deposition or by heat-assisted or non-heat-assisted diffusion.

As a variant, the incorporation of at least one chemical species can take place during polishing.

The second portion of copper can be formed by electrochemical deposition and the species can advantageously be incorporated during the electrochemical deposition.

Bonding can take place with a humidity level at least equal to 20%.

Advantageously, storage takes place at a temperature of between 75° C. and 100° C.

The structure can be a microelectronic and/or nanoelectronic structure, the portions of copper forming, for example, interconnection vias.

BRIEF DESCRIPTION OF THE FIGURES

This invention shall be better understood after reading the following description with reference to the appended figures, wherein.

DETAILED DESCRIPTION OF THE SPECIFIC EMBODIMENTS

The method according to this invention consists in producing an assembly by direct bonding between a first and a second surface, whereby the surfaces can include, for example, copper only, or at least the first surface includes at least one portion of copper and at least one portion of another material, for example a dielectric material, for example $SiO_2$, the second surface being made of copper only or comprising at least one portion of copper and at least one portion of another material, for example a dielectric material, or even the first surface comprises at least one portion of copper defined by at least one portion of dielectric material within portions of a third material, for example a semi-conductive material, the second surface capable of being made solely from copper or from a structure similar to the first surface.

Figure 1A:
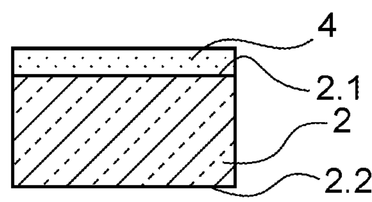
FIGS. 1A to 1C diagrammatically illustrate the steps for producing an element in view of its assembly by direct bonding with another element made in a similar manner.
Figure 1B:
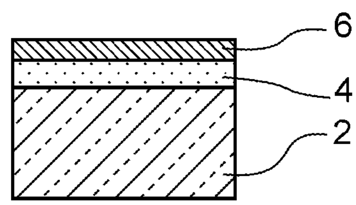
Figure 1C:
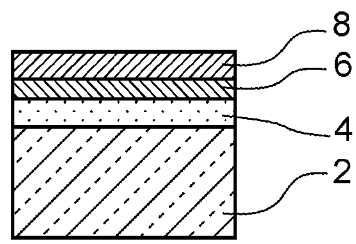

FIGS. 1A to 1C show the steps for producing an element intended to be assembled by direct bonding with an element produced using the same steps.

FIG. 1A shows a substrate 2, for example made from a semi-conductive material, for example silicon, for example doped with a p-type dopant, including a front side 2.1 and a rear side 2.2. The front side 2.1 of the substrate is covered by a layer of thermal oxide 4, in this example $SiO_2$, for example having a thickness of between 5 and 5000 nm, for example equal to 200 nm. Alternatively, the oxide layer can be omitted. During a first step, a layer of given material 6 is formed on the thermal oxide by physical vapour deposition (PVD). Alternatively, one or more specific layers, in particular gripping layers, can be provided beneath the layer 6, for example made from Ti.

The layer 6 acts as a base for growing a layer of copper, which will have a crystallinity such that it encourages the enhancing of the fracture energy of the assembly at ambient temperature between two elements each containing such a copper layer. Moreover, it prevents copper diffusion problems in the subjacent silicon and adhesion problems affecting the layer deposited.

We are looking to obtain a specific growth of the copper favouring the less dense planes, in particular the plane families (110) or (100), i.e. la the family of planes {110} includes the planes (110), (101) and (011) and the planes whose indexes are multiples of the indexes of the previous planes, for example (−110), (220), (330), (202), (022) . . . , and the family of planes {100} includes the planes (010), (001) and the planes whose indexes are multiples of the indexes of the previous planes, for example (−100), (020), (030), (003), (002), etc.

This preferential orientation of the copper grains of the polycrystalline layer according to the less dense crystalline planes encourages fast metallic oxidation kinetics.

It has been observed that fast metallic oxidation kinetics are encouraged when the ratio of the intensities of the peaks (220) and (111) obtained by X-Ray diffraction is greater than or equal to 0.5. The peak (220) is considered as it is the easiest to observe and has the greatest amplitude.

For copper, the orientation (220) is the most appropriate.

The layer 6 will be hereinafter referred to as the "growth layer". The material of the growth layer is chosen from titanium nitride $TiN_x$ and tantalum nitride $TaN_x$. Preferably, the growth layer is made from TiN.

The PVD deposition of the growth layer takes place at a low temperature between −196° C. (77K) and 250° C., preferably between 0° C. and 150° C. and more preferably between 20° C. and 100° C., or even between 20° C. and 50° C., i.e. at ambient or almost ambient temperature.

The growth layer 6 has a thickness of between 5 nm and 100 nm, for example a thickness of between 10 nm and 60 nm, for example equal to 20 nm.

The growth layer can also act as a barrier to the diffusion of the copper in the silicon, which produces a high integration degree. In the prior art, the growth layers used (deposited at over 250° C.) are chosen so as to prioritise copper growth according to the orientation (111) which provides the copper layer with improved electromigration resistance properties.

The deposition of the growth layer 6 can take place, for example, by sputtering in RF or DC power mode in a power range of 5 kW to 30 kW (for example 8 kW DC), at a temperature between 20° C. and 250° C. (for example 20° C.), with argon and dinitrogen flows between 5 sccm and 200 sccm, for example 45 sccm Ar and 85 sccm $N_2$.

The element thus obtained is shown in FIG. 1B.

During a following step, a copper layer 8 is formed on the growth layer 6. Preferably, the copper layer 8 is formed by physical vapour deposition. Therefore, the copper layer 8 can be formed without putting the element back into air. Indeed, the same PVD unit can be used for depositing the growth layer 6 and depositing the copper layer 8. Alternatively, the copper layer can be deposited by chemical vapour deposition (CVD).

The layer 8 has a thickness preferably between 10 nm and 1 μm, for example equal to 500 nm. The physical deposition of the copper layer can take place, for example in DC mode, at a power of between 0.5 kW and 30 kW (for example 3 kW) at temperatures between 20° C. and 400° C., for example 20° C., and under argon flows from 5 to 200 sccm (for example 50 sscm).

For the chemical deposition of the copper layer, the temperature will be between 200° C. and 400° C., for example 200° C., under total inert gas and precursor pressures of between 0.5 mTorr and 2 mTorr, for example 1.15 mTorr, and under flows of helium, dihydrogen, dinitrogen and precursor gases known by one of ordinary skill in the art and marketed by Applied Materials or Alliance Concept equipment manufacturers, for example.

The element E1 thus obtained is shown in FIG. 1C. Preferably, annealing then takes place to stabilise the layer microstructure.

A second element E2 is produced according to the steps described in FIGS. 1A to 1C.

The front side of each element E1, E2 therefore comprises a copper layer 8, 108 having a preferential crystallinity along the (220) direction.

During a subsequent step, a polishing step for polishing the front sides takes place so as to obtain a roughness less than 1 nm RMS (Root Mean Square), advantageously less than 0.5 nm RMS. The roughness measurement is taken by AFM on 1×1 $\mu m^2$ scans. This polishing step takes place, for example, by chemical-mechanical polishing. Moreover, the surfaces have a hydrophilic surface. In this application, a surface is considered to be hydrophilic if the angle of contact between a drop of water and the surface is between 0° and 20°, preferably as low as possible.

Preferably, the surfaces are cleaned in order to remove particles caused by polishing and most of the corrosion inhibitors. This cleaning can, for example, consist in basic chemical brushing.

Figure 2A:
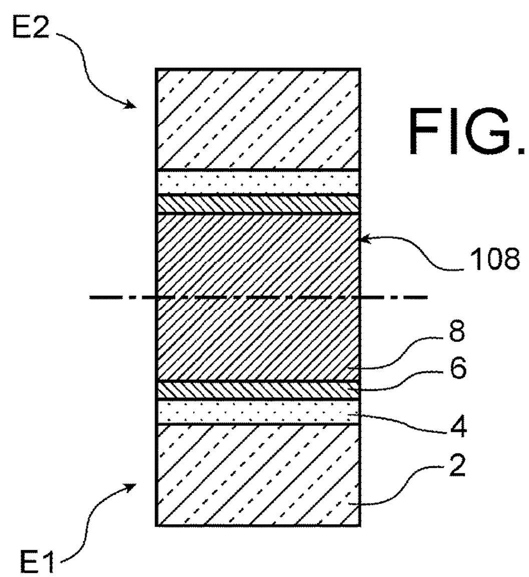
FIGS. 2A to 2C show different structures obtained using the method according to the invention.

During a subsequent step shown in FIG. 2A, the two elements E1, E2 are brought into contact with each other via their front surface at a low temperature (typically between 5° C. and 50° C., and typically about 15° C. to 25° C.), in a humid atmosphere, advantageously in air, with a level of humidity advantageously exceeding 20%, for example 40%, which corresponds to the humidity level in a clean room in the microelectronics industry. The atmosphere during direct bonding can advantageously be enriched with oxygen or water vapour. These bonding conditions are chosen so as not to alter the surface properties (roughness, hydrophilicity, etc.) enabling the adhesion mechanism by direct bonding as defined hereinabove.

Preferably, bonding takes place relatively soon after polishing and cleaning, preferably within 120 minutes of cleaning, more preferably within 20 minutes of cleaning.

The structure thus obtained is shown in FIG. 2A, wherein the bonding interface is symbolised by a dotted line.

After the contact phase, the structure is stored for several days, or even several weeks, at a low temperature to enable the direct bonding interface to reach a high enough fracture energy.

In this application, "low temperature" for storage is understood as a temperature between 0 or 5° C. and 100° C. and typically around an ambient temperature between 15 and 30° C.

During storage, the copper-copper fracture energy is enhanced due to a metallic oxidation mechanism at the level of the bonding interface. The enhancing takes place by copper diffusion through its oxide layer, which results in oxidation due to the presence of water from the hydrophilic surfaces in contact with each other. This oxidation therefore increases the thickness of the interface oxide layer. The inventors have noticed that the specific orientations of the copper layers obtained by growth on a growth layer deposited by PVD were suitable for the fast diffusion of the copper through its oxide, which results in faster oxidation kinetics and therefore an equally faster enhancing process at ambient temperature.

In order to illustrate the advantages, different structures S1 to S4 were produced. In order to control the crystallinity of the copper layer obtained for these different structures, the ratios of the intensities of the peaks were calculated, said peaks representing the orientation (220) and (111) of the copper layer obtained by X-Ray diffraction for different elements. These peaks observed are references for the powder diffraction standards in the JCPDS Copper file No. 04-0836. These peaks are those of the copper layer 8.

The structure S1 corresponds to an assembly obtained by bonding two plates comprising a metal-organic chemical vapour deposition (MOCVD) of titanium nitride TiN of 20 nm in thickness followed by a deposition of copper Cu sputtered by PVD of 500 nm in thickness after polishing. The ratio obtained for this structure is 0.23.

The structure S2 corresponds to the assembly obtained by bonding two plates comprising an MOCVD deposition of titanium nitride TiN of 20 nm in thickness followed by a deposition of copper Cu sputtered by PVD of 200 nm in thickness and an electrochemical deposition of 800 nm in thickness, brought to 500 nm in thickness after polishing. The ratio obtained for this structure is 0.39.

For the structures S1 and S2, the intensity ratio (220) over (111) is strictly less than 0.5: the copper deposited on the TiN deposited by CVD therefore has a mostly (111) orientation.

The structure S3 corresponds to the assembly obtained by the bonding of two plates comprising a PVD deposition under the aforementioned temperature conditions of titanium nitride TiN of 20 nm in thickness, followed by a deposition of copper Cu sputtered by PVD of 1000 nm in thickness, brought to 500 nm in thickness after polishing. The ratio obtained for this structure is 9.35.

The structure S4 corresponds to the assembly obtained by bonding two plates comprising a PVD deposition of titanium nitride TiN of 20 nm in thickness followed by a deposition of copper Cu sputtered by PVD of 200 nm in thickness and an electrochemical deposition of copper of 800 nm in thickness, brought to 500 nm in thickness after polishing. The ratio obtained for this structure is 0.67.

The copper layers 8 according to the structures S3 and S4 have intensity ratios (220) over (111) greater than or equal to 0.5, corresponding to a preferential orientation (220) or any corresponding orientation described hereinabove. As shown with reference to FIG. 3, this orientation improves the kinetics for enhancing the copper-copper fracture energy at ambient temperature.

All of these structures S1, S2, S3 and S4 were then stored at ambient temperature.

Figure 3:
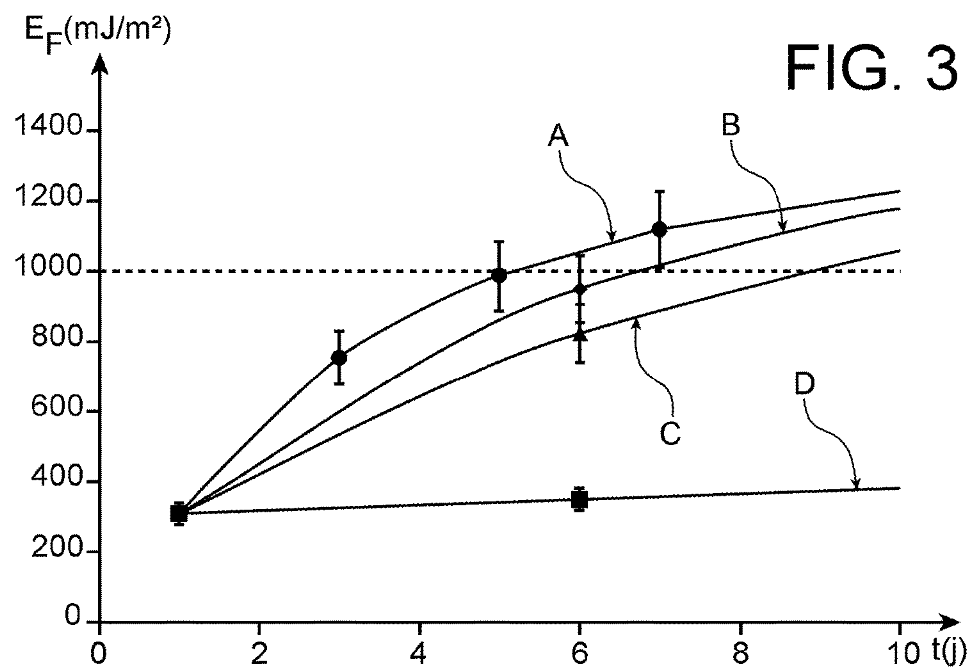
FIG. 3 shows the variation of the fracture energy in $mJ/m^2$ according to the time in days for a structure produced according to the invention and for structures produced according to the methods of the prior art, FIG. 4 diagrammatically illustrates a structure obtained with the method according to the invention, the structure comprising portions of copper, dielectric medium and semiconductor at the level of the assembly surfaces.

FIG. 3 shows the variation in fracture energy EF in $mJ/m^2$ according to time t in days for structures produced according to the invention (curves A and B which respectively correspond to structures S4 and S3) and structures from the prior art, wherein curve C corresponds to the fracture energy of the structure S1 and curve D corresponds to the fracture energy of the structure S2.

The fracture energies were measured using the DCB method (Double Cantilever Beam still known as the blade-insertion method) from the length of detachment after the insertion of a blade at the level of the bonding interface.

The fracture energy of the structure obtained according to the invention (curves A and B) is seen to reach the fracture energy of 1000 $mJ/m^2$ (minimum mechanical strength compatible with integration methods) in less time than those obtained by the methods of the prior art (curves C and D).

Storage can take place at ambient temperature, however advantageously, heat treatment can take place at low temperature during this storage, for example between 75° C. and 100° C., which accelerates the kinetics for enhancing the closing of the interface and therefore reduces the assembly storage time. Typically, storage at 100° C. can reduce the storage time by at least 50%.

The storage atmosphere has little effect. This could involve storage in air.

In a very advantageous manner, one or more species favourable for the fast diffusion of copper through its surface oxide and therefore for the kinetics for enhancing the fracture energy at ambient temperature, can be incorporated into or onto the copper layer 8, on the surface of the copper layer 8, which enables the fracture energy enhancing speed to be controlled. This can, for example, involve a layer of copper deposited in an electrolytic manner (ECD) on the copper layer deposited by physical means and having the preferential orientation (220) according to an aforementioned peak ratio greater than or equal to 0.5. Alternatively, the species is incorporated via ion implantation, for example by using an energy between 10 keV and 200 keV and the implanted dose is, for example, between $10^{14}$ and $10^{17}$ atoms/$cm^2$. The additional species can be, for example, boron, carbon, phosphorus, sulphur, chlorine or oxygen.

Alternatively, boron can be incorporated via diffusion for a total boron dose equal to $5.10^{15}$ atoms/$cm^2$. This diffusion can take place, for example, using a first CVD deposition under a $B_2H_6$ flow, then by homogenising at temperatures between 200 and 600° C.

Alternatively, these species can be integrated into the chemical solution, chemical mixture, also referred to as slurry, intended for the chemical-mechanical polishing.

Figure 2B:
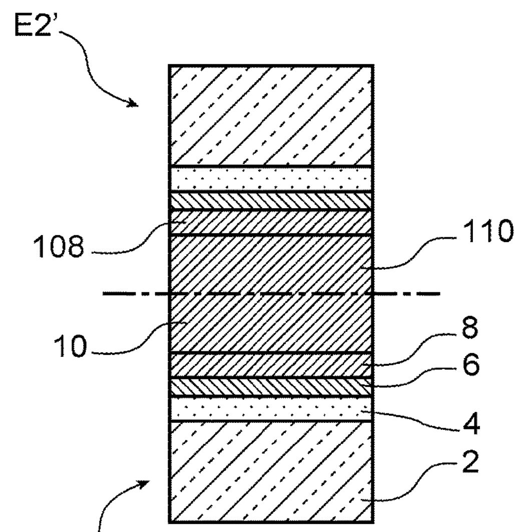
Figure 2C:
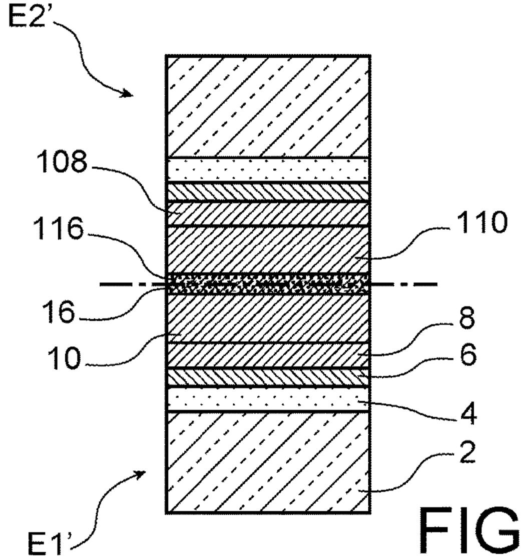

FIGS. 2B and 2C show another example embodiment of elements E1', E2' in view of their assembly by direct bonding.

In this example embodiment, a second copper layer 10, 110 is deposited on the copper layer 8, 108, which thus forms a germination layer for each element E1', E2'. For example, the second copper layer 10, 110 is formed by electrochemical deposition. The thickness of the layer 8 can be between 50 nm and 5000 nm, and is, for example, about 200 nm, and the thickness of the layer 10 can be between 50 nm and 50 μm, and is, for example, equal to 300 nm.

The layer 10 of copper also has a crystallinity that allows for faster kinetics for enhancing the fracture energy of the assembly, due to the presence of impurities linked to this type of layer and favouring copper diffusion.

The production of a copper layer by electrochemical deposition on a thin copper layer by physical vapour deposition has the advantage of a reduced cost price. Moreover, electrochemical deposition is more efficient in the case of surfaces with raised portions.

In a very advantageous manner, in the case of the incorporation of at least one chemical species in or on the copper layer used for bonding, the electrochemical deposition bath can be used to contain the chemical species. They are therefore incorporated at the same time as the layer 10 is deposited. In FIG. 2C, the incorporation of the chemical species is illustrated by layers 16, 116.

As a variant, the second copper layer 10, 110 can be deposited using another method, from among physical vapour deposition, chemical vapour deposition, atomic layer deposition (ALD), and their alternatives with assistance from plasma, ion beams, laser, or under low-pressure gas flows, etc.

Figure 4:
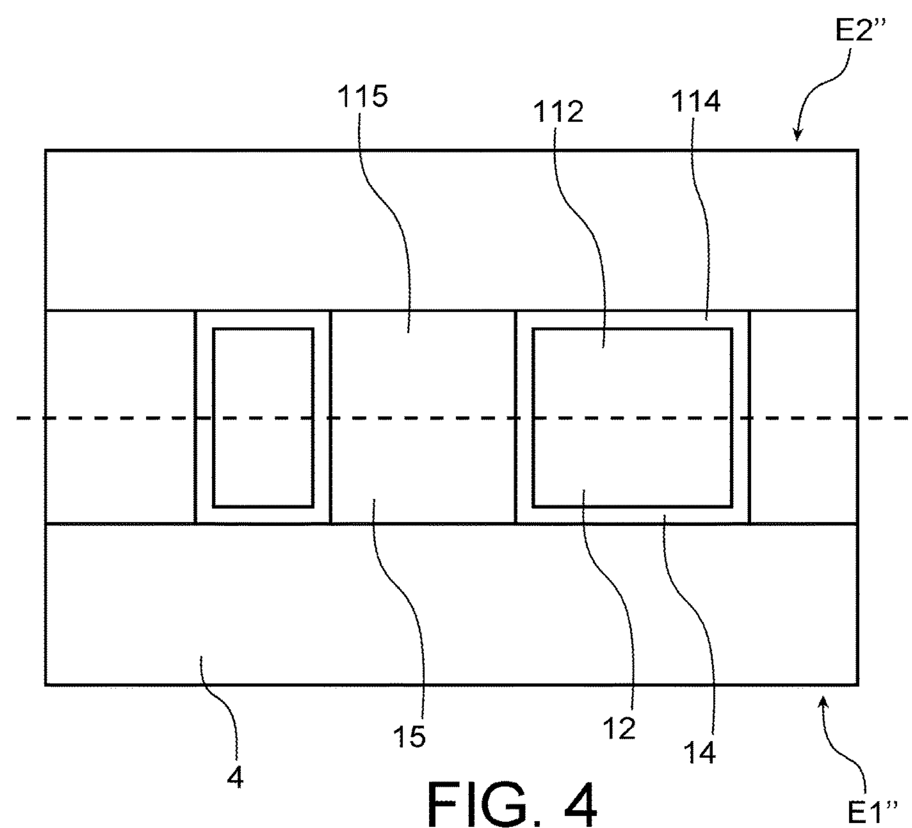

This invention enables surfaces to be assembled together, said surfaces comprising patterns or structured surfaces, as illustrated in FIG. 4. For example, the assembled elements E1", E2" each comprise assembly surfaces including portions of copper 12, 112 surrounded by portions of growth layer, for example TiN 14, 114, which are surrounded by $SiO_2$ 15, 115.

Interconnection vias can, for example, be produced for three-dimensional integration. Indeed, the TiN deposited via physical vapour deposition is uniform, even in structures such as vias having a low aspect ratio. The dimensions of the vias in 3D integration are typically from 5 μm to 10 μm in diameter d for a depth h of 1 to 2 μm for an aspect ratio h/d of 1/5.

The surfaces are therefore produced such that the portions of copper are not withdrawn from the assembly surface in relation to the TiN and $SiO_2$ so that direct bonding takes place effectively between the portions of copper.

Thanks to the invention, the copper assembly has a high mechanical strength, for example capable of supporting all stresses induced by the methods after bonding, at a low temperature, and in particular at ambient temperature.

Furthermore, the enhancing kinetics are improved. Therefore, at least the same fracture resistance as assemblies from the prior art is obtained more quickly, for example around a few days, typically less than one week. This time saved is particularly advantageous within the scope of industrial manufacturing.

Moreover, the assembly can take place at a very low temperature, for example at ambient temperature; it is therefore particularly advantageous within the scope of heterostructural bonding as the problem posed by the thermal expansion difference between the materials does not apply.

It shall be understood that the assembly of two elements comprising layers produced in different manners on the growth layer formed by PVD is not excluded from the scope of this invention.

The invention claimed is:

1. A production method for producing a structure by direct bonding of two elements, the method comprising producing elements to be assembled and assembling the elements, wherein:

the producing of the elements comprises:

depositing at least one growth portion made from at least one material selected from the group consisting of $TiN_x$ and $TaN_x$ on a substrate, the growth portion being deposited by physical vapor deposition, and depositing at least one first portion of copper on all or part of the growth portion, conditions for depositing the growth portion by physical vapor deposition being such that a ratio between an intensity of the peak representing the orientation (220) and an intensity of the peak representing the orientation (111) in the first portion of copper is greater than or equal to 0.5, whereby the peaks are measured by X-Ray diffraction; and the assembling of the elements comprises:

polishing surfaces of the first portion of copper intended to come into contact so that they have a roughness of less than 1 nm RMS and hydrophilic properties, to obtain polished surfaces, bringing the polished surfaces into contact, to obtain a structure, and storing the structure at a low temperature.

2. The production method according to claim 1, wherein the depositing of the growth portion by physical vapor deposition occurs at a temperature between −196° C. and 250° C.

3. The production method according to claim 1, wherein the depositing of the growth portion by physical vapor deposition occurs at a temperature between 20° C. and 100° C.

4. The production method according to claim 1, wherein conditions for the depositing of the growth portion by physical vapor deposition are such that the first portion of copper has a growth favoring less dense planes of families (110) and (100).

5. The production method according to claim 1, wherein the material of the growth portion is TiN.

6. The production method according to claim 1, wherein the first portion of copper is formed by physical vapor deposition.

7. The production method according to claim 1, wherein, on least one of the elements, at least one second portion of copper is formed on the first portion of copper.

8. The production method according to claim 7, wherein the second portion of copper is formed by electrochemical deposition, atomic deposition, physical vapor deposition, or chemical vapor deposition.

9. The production method according to claim 7, further comprising incorporating at least one chemical species in or on the first or second portion of copper.

10. The production method according to claim 9, wherein the at least one chemical species is at least one selected from the group consisting of boron, carbon, phosphorus, sulfur, chlorine and oxygen.

11. The production method according to claim 9, wherein the incorporating of the at least one chemical species occurs by ion implantation and deposition or by heat-assisted or non-heat-assisted diffusion.

12. The production method according to claim 9, wherein the incorporating of the at least one chemical species occurs during the polishing.

13. The production method according to claim 9, wherein the second portion of copper is formed by electrochemical deposition and the chemical species is incorporated during the electrochemical deposition.

14. The production method according to claim 1, wherein the storing occurs at a temperature of between 75° C. and 100° C.

15. The production method according to claim 1, wherein the bringing the polished surfaces into contact occurs at a humidity level at least equal to 20%.

16. The production method according to claim 1, wherein the structure is a microelectronic structure, a nanoelectronic structure, or both.

17. The production method according to claim 16, wherein the portions of copper form interconnection vias.

* * * * *